(12) United States Patent
Mitani

(10) Patent No.: US 6,784,494 B2
(45) Date of Patent: Aug. 31, 2004

(54) PRODUCTION METHOD FOR SOI WAFER AND SOI WAFER

(75) Inventor: Kiyoshi Mitani, Annaka (JP)

(73) Assignee: Shin-Etsu Handotai, Co., Ltd., Tokyo (JP)

(*) Notice: Subject to any disclaimer, the term of this patent is extended or adjusted under 35 U.S.C. 154(b) by 168 days.

(21) Appl. No.: 10/203,752

(22) PCT Filed: Dec. 17, 2001

(86) PCT No.: PCT/JP01/11023

§ 371 (c)(1),
(2), (4) Date: Aug. 13, 2002

(87) PCT Pub. No.: WO02/50912

PCT Pub. Date: Jun. 27, 2002

(65) Prior Publication Data

US 2003/0075260 A1 Apr. 24, 2003

(30) Foreign Application Priority Data

Dec. 18, 2000 (JP) .................... 2000-384379

(51) Int. Cl.[7] .............................. H01L 21/04
(52) U.S. Cl. ........................... 257/347; 257/349
(58) Field of Search .................. 257/66–67, 347–353

(56) References Cited

U.S. PATENT DOCUMENTS

| | | |
|---|---|---|
| 5,538,904 A | 7/1996 | Mitani et al. |
| 5,763,288 A | 6/1998 | Sakaguchi et al. |
| 5,773,151 A | 6/1998 | Begley et al. |
| 6,171,932 B1 | 1/2001 | Shiota |
| 2002/0000554 A1 * | 1/2002 | Yamazaki et al. ............ 257/59 |

FOREIGN PATENT DOCUMENTS

| | | |
|---|---|---|
| EP | 0 603 849 A2 | 6/1994 |
| EP | 0 645 632 A1 | 3/1995 |
| EP | 0 975 011 A1 | 1/2000 |
| JP | 6-244389 | 6/1994 |
| JP | 7-153808 | 3/1995 |
| JP | 8-24551 | 1/1996 |
| JP | 9-45882 | 2/1997 |
| JP | 10-165730 | 6/1998 |
| JP | 2000-100676 | 4/2000 |
| WO | WO 97/02598 | 1/1997 |

* cited by examiner

Primary Examiner—H. Jey Tsai
(74) Attorney, Agent, or Firm—Snider & Associates; Ronald R. Snider

(57) ABSTRACT

A silicon oxide film 3', 3" is formed on each of the main surfaces of a first silicon single crystal substrate 1 (bond wafer) and a second silicon single crystal substrate 2 (base wafer), and the first and second silicon single crystal substrates are then brought into close contact so as to locate the silicon oxide films 3', 3" in between in an atmosphere of a clean air supplied through a boron-releasable filter, to thereby produce an SOI wafer 10. The second silicon single crystal substrate 2 employed herein comprises a silicon single crystal substrate having a bulk resistivity of 100 Ω·cm or above. In thus produced SOI wafer 10, the silicon oxide film 3 has a depth profile of boron concentration in which the boron concentration reaches maximum at a thickness-wise position. This ensures manufacturing of SOI wafer excellent in high-frequency characteristics.

1 Claim, 5 Drawing Sheets

PRODUCTION METHOD FOR SOI WAFER AND SOI WAFER

FIELD OF THE INVENTION

The present invention relates to a method for manufacturing SOI wafer and thus-manufactured SOI wafer.

BACKGROUND OF THE INVENTION

There has been a general trend of handling high-frequency signal of several hundred MHz or above in recent mobile communication typically using cellular telephones, which strongly demands semiconductor devices with excellent high-frequency characteristics. Semiconductor devices such as CMOS-IC and high-voltage IC typically employ so-called SOI wafer comprising a silicon single crystal substrate (also referred to as "base wafer" hereinafter), a silicon oxide layer (buried oxide film) formed thereon, and another silicon single crystal layer stacked further thereon as an SOI (silicon-on-insulator) layer. For the purpose of fabricating semiconductor devices for high-frequency use on the SOI wafer, it is necessary for the base wafer to be composed of a high-resistivity silicon single crystal in order to reduce high frequency loss.

One representative process for manufacturing the SOI wafer relates to bonding process. According to the bonding process, a first silicon single crystal substrate (also referred to as "bond wafer" hereinafter), which provides an SOI layer affording device formation area, and a second silicon single crystal substrate which serves as a base wafer are bonded so as to locate a silicon oxide film in between, and the bond wafer is then reduced in the thickness thereof so as to be thinned to a film having a predetermined thickness, to thereby convert the bond wafer to the SOI layer.

In the above-described bonding process, a bonding interface between the base wafer and the bond wafer may sometimes catch foreign matters such as particles. Such foreign matters accidentally residing on the bonding interface may induce lattice defect such as void, degraded wafer characteristics typically due to diffusion of impurities, and degraded bonding strength between both substrates. The substrates are thus bonded in a clean room (or in a clean area) so as to avoid the contamination of foreign matters into the bonding interface. In the manufacture of SoI wafer by the bonding process, it is a general practice to form the silicon oxide film only on the surface of the bond wafer, and then bond the base wafer with the bond wafer so as to locate the silicon oxide film in between.

Another known problem resides in that the clean room, which is a site of the wafer bonding, usually contains in the atmosphere thereof boron which is derived from the air filter, and which boron can be incorporated as an impurity into the bonding interface. Boron thus incorporated into the bonding interface diffuses during high-temperature annealing (bonding annealing) for raising bonding strength or during annealing for forming devices. In this point of view, the foregoing bonding process in which the silicon oxide film is formed only on the bond wafer hardly affects the devices since the boron diffusion into the SOI layer (device forming area) is blocked by the silicon oxide film. This is one reason why the foregoing bonding process in which the bond wafer, only on which the silicon oxide film is formed, is bonded with the base wafer is widely accepted. Whereas the bonding interface between the base wafer and silicon oxide film still suffers from adsorption of boron derived from the air filter, so that the boron diffusion into the base wafer is still inevitable during the foregoing bond-annealing.

The above-described boron diffusion into the base wafer has not attracted much attention so far as a silicon single crystal substrate having a normal-to-low resistivity is used as the base wafer. The problem of degradation of high-frequency characteristics however arises in the SOI wafer for high-frequency use, since the base wafer has a resistivity of as high as hundreds to thousands $\Omega \cdot cm$, and the resistivity of an interfacial portion of the base wafer several micrometers deep from the interface with the silicon oxide film may considerably be lowered due to the boron diffusion.

One solution for the foregoing problem is disclosed in Unexamined Japanese Patent Publication No. 2000-100676, in which SOI wafer is manufactured by properly selecting types of the air filter used for introducing air into a clean room to thereby control the amounts of boron as a p-type impurity together with n-type impurity in the bonding atmosphere. The methods disclosed in the patent are such that:

1. using a boron-free filter system which comprises a PTFE filter and a boron-adsorptive chemical filter irrespective of conductivity type of the base wafer. Using the boron-free filter is beneficial to suppress boron-induced degradation in resistivity of the base wafer particularly for the case that the base wafer comprises a p-type silicon single crystal substrate having a high resistivity; and 2. using a boron-releasable HEPA filter when the base wafer comprises an n-type silicon single crystal substrate having a high resistivity. Degradation of the resistivity is avoidable even if boron is adsorbed since the adsorbed boron is compensated by the n-type dopant contained in the n-type silicon single crystal substrate.

The foregoing method 1 is however disadvantageous in that the boron-free filter system is expensive and is less economical. While the method 2 is applicable to the case the n-type base wafer is used, it is of course inapplicable to the case the p-type base wafer is used. The paragraph 0150 of the foregoing patent publication also describes difficulty in use of the HEPA filter for the high-resistivity, p-type wafer. It is also anticipated that even the resistivity of the n-type wafer may degrade unless concentrations of the n-type dopant and the filter-derived adsorbed boron are properly balanced.

SUMMARY OF THE INVENTION

An object of the present invention therefore resides in providing a method for manufacturing SOI wafer less causative of degradation of resistivity of the base wafer even when a high-resistivity silicon single crystal substrate of either conductivity type is used as the base wafer and is bonded in a boron-containing atmosphere; and also in providing an SOI wafer producible by such method, capable of retaining high resistivity of the base wafer by localizing boron incorporated during the bonding, capable of retaining desirable electrical characteristics of the SOI layer, and excellent in high-frequency characteristics.

To solve the foregoing problem, the method for manufacturing SOI wafer of the present invention comprises a bonding step including a process of bringing the main surfaces of a first silicon single crystal substrate and a second silicon single crystal substrate, each of such main surfaces having previously formed thereon a silicon oxide film, into close contact so as to locate such silicon oxide films in between; and a thickness reducing step for reducing the thickness of such first silicon single crystal substrate to thereby convert it into an SOI layer, wherein such second silicon single crystal substrate comprises a silicon single crystal substrate having a bulk resistivity of 100 Ω·cm or above, and such process of bringing the main surfaces into close contact in such bonding step is proceeded in an atmosphere of a clean air supplied through a boron-releasable filter.

The present invention employs a silicon single crystal substrate having a bulk resistivity of 100 Ω·cm or above as the second silicon single crystal substrate (corresponded to the base wafer), and dare employs, in order to bring such substrate into close contact, an atmosphere containing a high concentration of boron derived from the air filter, which is usually found in ordinary clean rooms. The atmosphere is composed of a clean air supplied through a boron-releasable filter (which is exemplified by HEPA filters disclosed in Unexamined Japanese Patent Publications Nos. 10-165730 and 8-24551). In the present invention, the silicon oxide film is respectively formed on both of the second silicon single crystal substrate and the first silicon single crystal substrate (corresponded to the bond wafer), and both silicon oxide films are then brought into contact with each other.

The SOI wafer of the present invention comprises a silicon single crystal substrate; a silicon oxide film formed on the main surface of such silicon single crystal substrate; and an SO layer comprising a silicon single crystal layer formed on such silicon oxide film, wherein such silicon single crystal substrate has a bulk resistivity of 100 Ω·cm or above, and such silicon oxide film has a depth profile of boron concentration in which the boron concentration reaches maximum at a thickness-wise position more closer to the silicon single crystal substrate away from the center of the film thickness.

According to the method for manufacturing SOI wafer of the present invention, the bonding interface is formed within the silicon oxide film, which means that boron which resides in the bonding atmosphere is confined within the silicon oxide film (buried oxide film). Since the diffusion coefficient of boron in the silicon oxide film is small, the boron diffusion into the SOI layer and silicon single crystal substrate (base wafer) can successfully be suppressed even after high-temperature annealing for raising bonding strength of the oxide films.

It is preferable herein that the thickness of the silicon oxide film formed on the base wafer is smaller than the oxide film formed on the bond wafer. By manufacturing the bonded SOI wafer based on such definition of the thickness of the oxide films on both wafers, the bonding interface is formed at a thickness-wise position more closer to the base wafer away from the center of the film thickness. This ensures the SOI wafer to have more stable device characteristics. The next paragraphs will describe the reason why.

To prevent the high-frequency characteristics of the SOI wafer from being degraded, it is necessary to avoid lowering of resistivity of the base wafer as described in the above. The present invention thus provides an effective measure whereby the oxide films are mutually bonded so as to confine the atmospheric boron into such oxide films. There is, however, still an apprehension that boron confined in the bonding interface may diffuse in the oxide film to reach the SOI layer or base wafer depending on various conditions such as boron concentration in the bonding atmosphere, bonding annealing, annealing for device fabrication, and thickness of buried oxide film necessary for device characteristics.

The concentration of boron possibly diffused through the oxide film might be fairly small as compared with the boron concentration in the vicinity of the bonding interface as described in the above, but even such small amount of boron can adversely affect the device characteristics ensured by the SOI layer if diffuses thereto, since the absolute amount of dopant intrinsically contained in the SOI layer as thin as 1 μm or less is quite small. Moreover, when there is a need for the thickness of buried oxide layer of as thin as 0.1 μm or less, thinner buried oxide film makes the bonding interface closer to the SOI layer. In a microscopic view, the bonding interface, however, has sites of incomplete chemical bond, and fixed charge ascribable to such sites may adversely affect the SOI layer in which device formation area will be reserved. Considering the above, the bonding interface is preferably formed in the buried oxide film closer to the base wafer.

On the other hand, the base wafer will suffer from only a slight degree of lowering in the bulk resistivity thereof and will cause only a fairly limited degradation of the high-frequency characteristics if a slight amount of boron diffused through the oxide film may be incorporated therein, since the absolute value of the dopant concentration of such base wafer is relatively large, despite its high resistivity, if a large thickness thereof is taken into consideration. It is also noteworthy that the fixed charge within the buried oxide film will never affect the base wafer which does not serve as active layer of devices.

As judged from the above, the thickness of the oxide film formed on the bond wafer is preferably 0.1 μor more in consideration of effects on the SOI layer exerted by boron diffused through the oxide film, or by fixed charge which resides in the bonding interface. The thickness of the oxide film exceeding 2 μm is, however, not practical since formation of such thick film needs a considerably long annealing time in a normal-pressure thermal oxidation furnace which is widely accepted.

The SOI wafer of the present invention will therefore be such that effectively suppressing the boron-induced lowering of the bulk resistivity of the silicon single crystal substrate, and being preferably applicable to high-frequency devices. It is also economical since use of an expensive facility such as boron-free filter system is no more necessary.

As the second silicon single crystal substrate (referred to as a silicon single crystal substrate in the bonded SOI wafer) employed in the method of the present invention, it is preferable to use a substrate having a resistivity of 100 Ω·cm or above, more preferably 500 Ω·cm or above, and still more preferably 1,000 Ω·cm or above in view of ensuring desirable high-frequency characteristics.

The bonding step in the method of the present invention may include an annealing process which is carried out within a temperature range from 1,150 to 1,300° C. so as to achieve sufficient bonding strength. For the purpose of bonding the oxide films with each other, annealing at a temperature below 1,150° C. may sometimes result in insufficient bonding strength. More specifically, the SOI wafer obtained after annealing below 1,150° C. may show only an insufficient chemical bonding strength when measured by immersing such wafer into an aqueous solution of hydrofluoric acid so as to assess the corrosion status, even after a sufficient mechanical bonding strength is observed typically in tensile strength test. On the other hand, annealing at 1,150° C. or above, preferably at 1,200° C. or above, ensures a satisfactory level of bonding strength not only mechanically but also chemically. The annealing temperature exceeding 1,300° C., however, will be more likely to generate slip dislocation, which is inappropriate since problems in durability of an annealing furnace and metal contamination tend to arise. The annealing temperature is thus preferably set at 1,250° C. or below from a practical viewpoint.

BEST MODE FOR CARRYING OUT THE INVENTION

Preferred embodiments of the present invention will be described hereinafter.

Figure 1A:
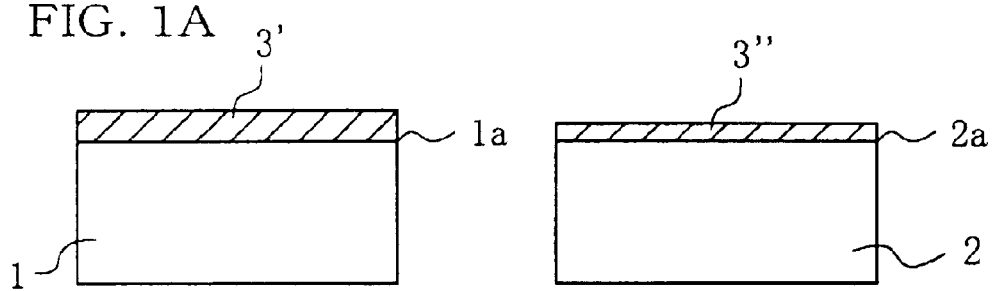
FIG. 1A is a drawing for explaining process of manufacturing the SOI wafer of the present invention.

FIGS. 1A to 1D are drawings for schematically explaining the method for manufacturing SOI wafer according to the present invention. First as shown in FIG. 1A, silicon oxide films 3', 3" are formed on main surfaces 1a, 2a of a bond wafer 1 as a first silicon single crystal substrate and a base wafer 2 as a second silicon single crystal substrate, respectively. The silicon oxide films can be formed not only by wet oxidation but also by dry process such as CVD (chemical vapor deposition) or the like. It is preferable that the silicon oxide film 3' on the bond wafer 1 is adjusted so as to have a thickness of 0.1 to 2 µm, and the silicon oxide film 3" on the base wafer 2 is formed so as to be thinner than the silicon oxide film 3' on the bond wafer 1. As the base wafer 2 herein a silicon single crystal substrate with a high resistivity (specifically 100 Ω·cm or above) is used. While the bond wafer 1 is not specifically limited, a substrate having a normal range of resistivity (approx. 1 to 20 Ω·cm) is generally used.

Figure 1B:
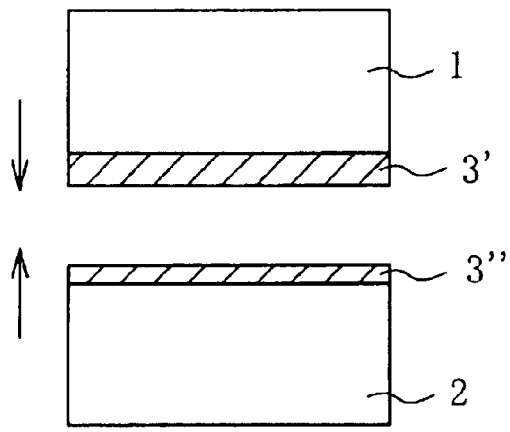
FIG. 1B is a drawing as continued from FIG. 1A.
Figure 2:
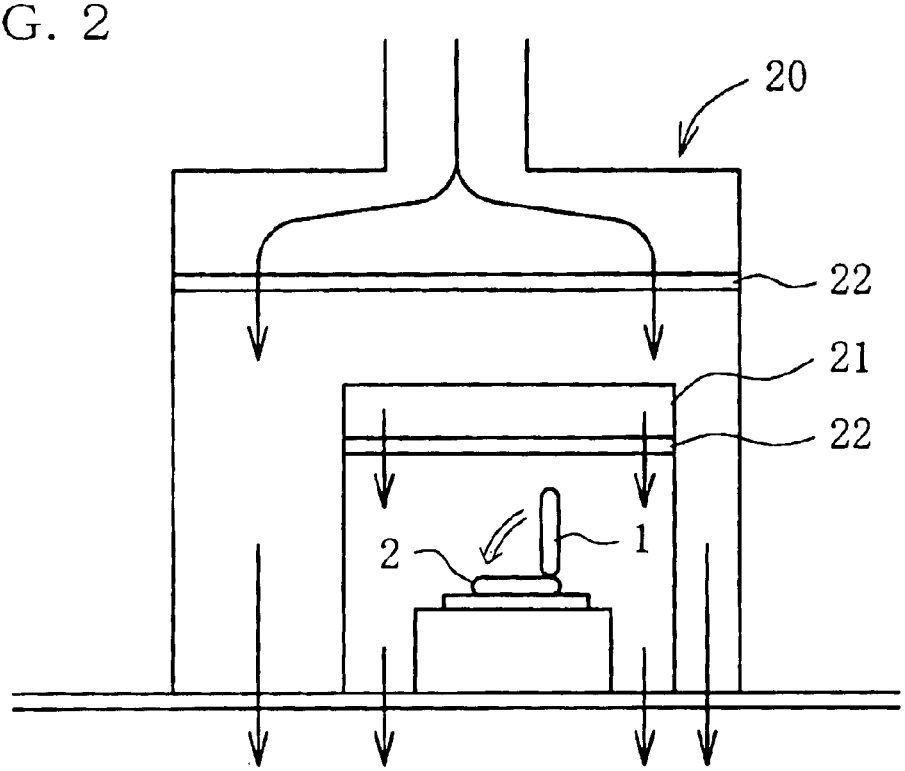
FIG. 2 is a schematic drawing of a clean room whereat the bonding step in the method for manufacturing SO wafer according to the present invention is carried out.

Next, at least the surfaces having formed thereon the silicon oxide films 3', 3" of the bond wafer 1 and base wafer 2 are cleaned using a cleaning solution, and the both wafers are then, as shown in FIG. 1B, brought into close contact on their sides where the silicon oxide films 3', 3" are formed at room temperature or around, and annealed in an annealing furnace at 1,150 to 1,300° C. to thereby tightly bond them with each other. Such bonding step can be carried out in a clean bench 21 housed in a clean room 20 as shown in FIG. 2. The inner atmosphere of the clean room 20 and clean bench 21 typically comprises a clean air supplied through a boron-releasable filter 22 such as HEPA filter. The saturated concentration value of boron deposited on the surface of the wafer, which is left in the clean bench 21 or the clean room 20, generally falls within a range from $10^{12}$ to $10^{13}$ atoms/cm².

Figure 1C:
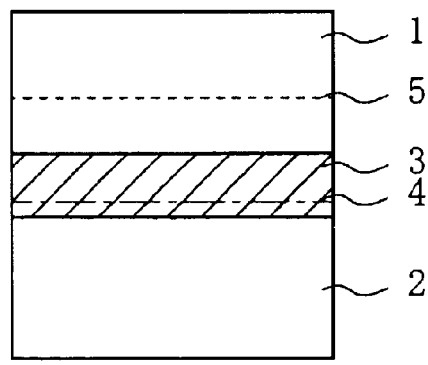
FIG. 1C is a drawing as continued from FIG. 1B.
Figure 1D:
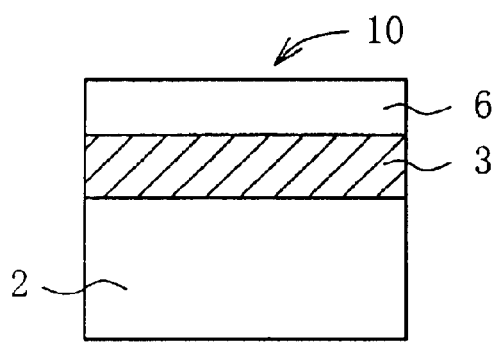
FIG. 1D is a drawing as continued from FIG. 1C.

By the annealing, the silicon oxide films 3', 3" are united to form a silicon oxide film 3 as shown in FIG. 1C, and by being interposed with such silicon oxide film 3 the bond wafer 1 and base wafer 2 are tightly bonded. The bonding interface 4 is thus formed within the silicon oxide film 3. Next, the bond wafer 1 is thinned to a targeted thinning plane 5 shown in FIG. 1C so as to leave the bond wafer 1 in a thickness sufficient for forming devices. After the thinning process, an SOI layer 6 having a predetermined thickness is remained as shown in FIG. 1D. The thinning process for reducing the thickness of the bond wafer 1 can be effected by various methods, and is by no means specifically limited in the present invention. One exemplary method relates to reduction in the thickness of the bond wafer 1 by grinding and polishing it from a plane opposite to the plane having already formed thereon the silicon oxide film 3 (referred to as "polishing process" hereinafter). For the purpose of further thinning after the polishing, a dry etching technique called PACE (plasma-assisted chemical etching) can typically be applied. It is a general strategy to combine these methods to thin the wafer to the targeted thinning plane 5.

Methods other than the foregoing polishing process include so-called Smart-Cut process (registered trademark). In this process, the bond wafer 1 is implanted with ions of a light-weight element such as hydrogen, helium, or the like prior to the bonding, then brought into close contact with the base wafer 2 so as to locate the oxide film in between, which is followed by annealing. The bond wafer 1 is separated at the portion where the light-weight element ions are implanted, to thereby give the SOI layer 6 of a predetermined thickness which serves as a device forming area. The Smart-Cut process is advantageous in that a separated portion of the bond wafer 1 obtained after the annealing can be recycled as a new bond wafer or base wafer. It is to be noted, however, that this process is advantageous in obtaining a relatively thin SOI layer, and it is difficult to produce a relatively thick SOI layer (typically 1 µm thick or above) since the depth of implantation of the light-weight element ions is as small as 0.1 to 1 µm or around.

Recent development efforts also resulted in a method in which the ions to be implanted after being excited in plasma, to thereby allow the separation at room temperature or around without any special annealing. Annealing for the separation will thus be omissible when such method is adopted to the present invention.

Figure 3:
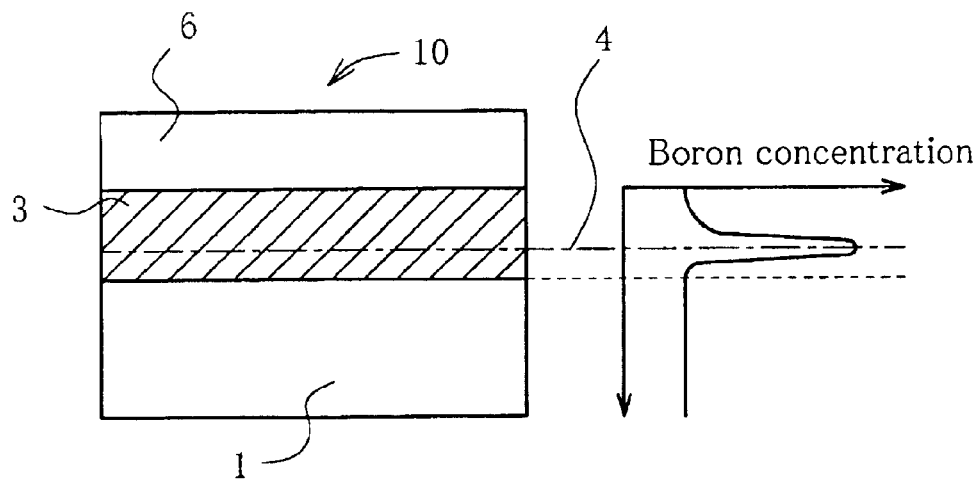
FIG. 3 is an explanatory chart showing the SOI wafer of the present invention and a depth profile of the boron concentration in the silicon oxide film.
Figure 5:
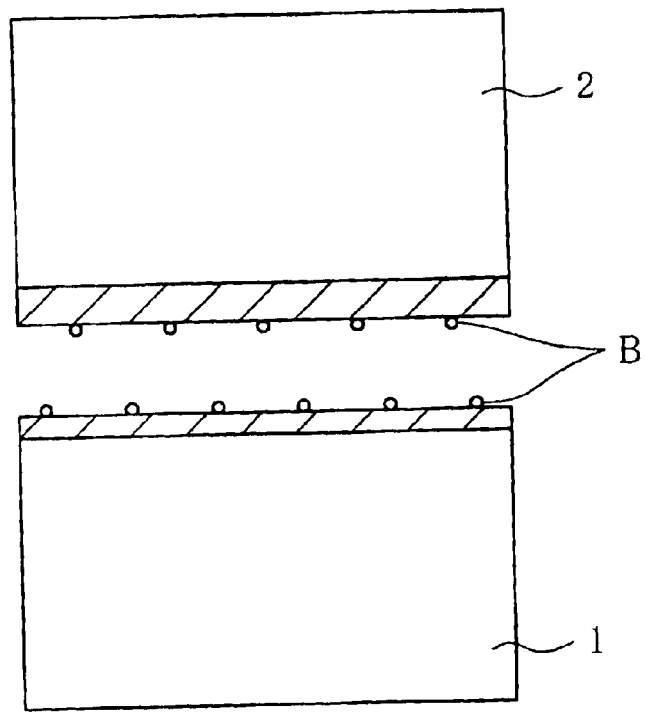
FIG. 5 is a drawing for explaining a mechanism according to which boron is incorporated into the silicon oxide film in the method of the present invention.
Figure 5:
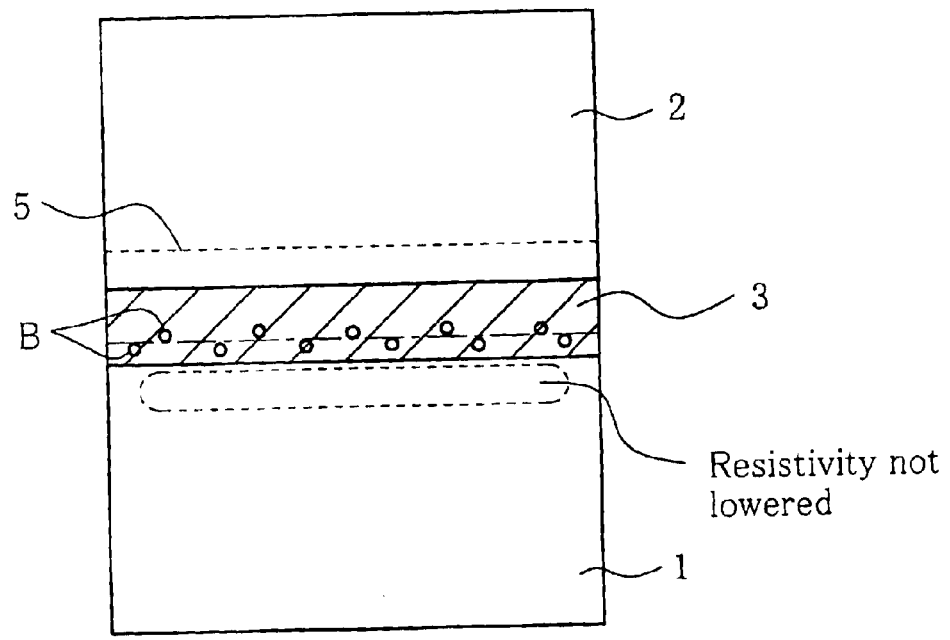

According to the foregoing processes, an SOI wafer 10 of the present invention as shown in FIG. 1D is obtained. In thus produced SOI wafer 10, the silicon oxide film 3 will have formed therein an intermediate position along the thickness-wise direction (a thickness-wise position closer to the base wafer away from the center of the thickness in this embodiment) whereat the boron concentration reaches maximum as shown in FIG. 3. This is because, as shown in FIG. 5, boron B previously adheres on the surface of the silicon oxide film 3 prior to the bonding, and the bonding is carried out while retaining the adhesion status, which allows boron B to be incorporated within the silicon oxide film. Boron concentration will be maximum in the vicinity of the bonding interface 4. The position whereat the boron concentration reaches maximum can vary depending on the relation between thickness of the silicon oxide film 3' formed on the bond wafer 1 and the silicon oxide film 3" formed on the base wafer 2. When the thickness of the silicon oxide film 3' on the bond wafer 1 and the thickness of the silicon oxide film 3" on the base wafer 2 are almost equivalent, the bonding interface 4 is formed approximately at the center of the united silicon oxide film 3, so that the position whereat the boron concentration reaches maximum also falls approximately on the center. However, the position whereat the boron concentration reaches maximum is preferably closer to the base wafer 2 based on the foregoing reason.

(Example and Comparative Example)

The following experiment was carried out in order to confirm the effects of the present invention.

Silicon single crystal substrates which serve as a bond wafer and a base wafer were sliced out from silicon single crystal ingots pulled by the MCZ (magnetic-field-applied Czochralski) method. The bond wafer employed herein was a p-type silicon single crystal substrate having a diameter of 200 mm, a resistivity of 10 Ω·cm, an interstitial oxygen concentration of 12 ppma (based on the standards by JEIDA (Japanese Electronic Industry Development Association)), a thickness of 725 μm and a crystal orientation of <100>, and the base wafer employed herein was a p-type silicon single crystal substrate having a diameter of 200 mm, a resistivity of 1,200 Ω·cm, an interstitial oxygen concentration of 6 ppma (JEIDA standards), a thickness of 725 μm and a crystal orientation of <100>.

On the individual main surfaces of the foregoing base wafer and bond wafer, the silicon oxide films were formed by the method described below. On the bond wafer, a silicon oxide film of 0.5 μm thick was formed by wet oxidation under annealing conditions of 1,050° C. for 120 minutes, and on the base wafer, a silicon oxide film of 0.1 μm thick was formed by wet oxidation under annealing conditions of 800° C. for 100 minutes.

Figure 4:
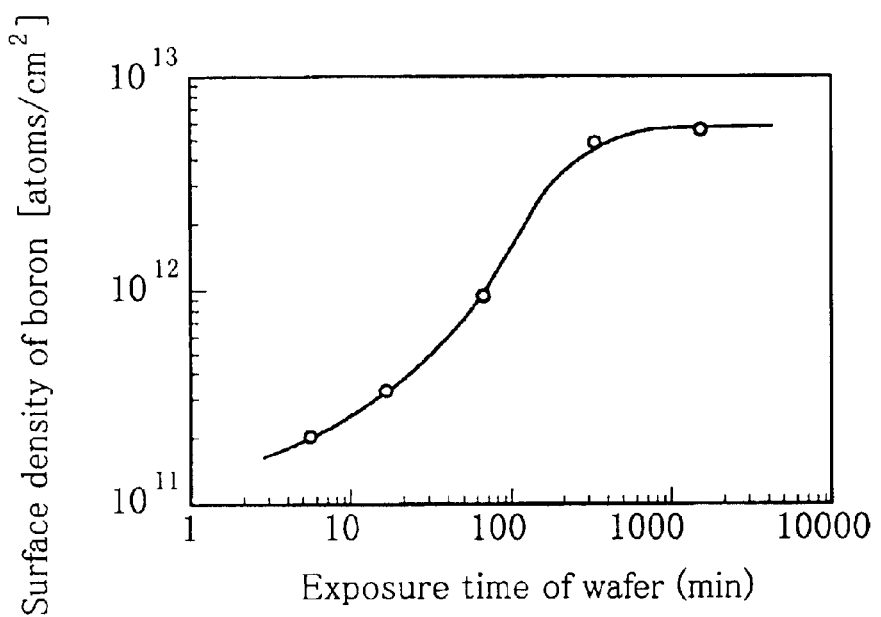
FIG. 4 is a graph showing a relation between exposure time of wafer and concentration of boron deposited on the surface of the wafer (surface density)

The bond wafer having thus formed thereon the silicon oxide film was then implanted with hydrogen ions, where an ion acceleration energy was 46 keV, and an amount of dose was $8 \times 10^{16}/cm^2$. The bond wafer and base wafer were then subjected to SC-1 cleaning, and stacked with each other in a clean bench of a clean room having an atmosphere purified by a HEPA filter at room temperature, to thereby bring them into close contact. A relation between exposure time of wafer and concentration of boron deposited on the surface of the wafer (surface density) was as shown in FIG. 4, from which the exposure time in this experiment was determined as 60 minutes.

Thus stacked wafers were annealed at 500° C. for 30 minutes to thereby bond them, and concomitantly the bond wafer was allowed to cleave at the hydrogen ion implanted layer to thereby produce the SOI layer of approx. 0.3±0.005 μm thick. The substrate having formed thereon the SOI layer was then annealed at 1,200° C. for 60 minutes for the purpose of enhancing the bonding strength of the bonding interface to thereby obtain an SOI wafer (Example). On the other hand in Comparative Example, another SOI wafer was manufactured similarly to Example except that the silicon oxide film was formed only on the bond wafer in a thickness of 0.6 μm.

Figure 6:
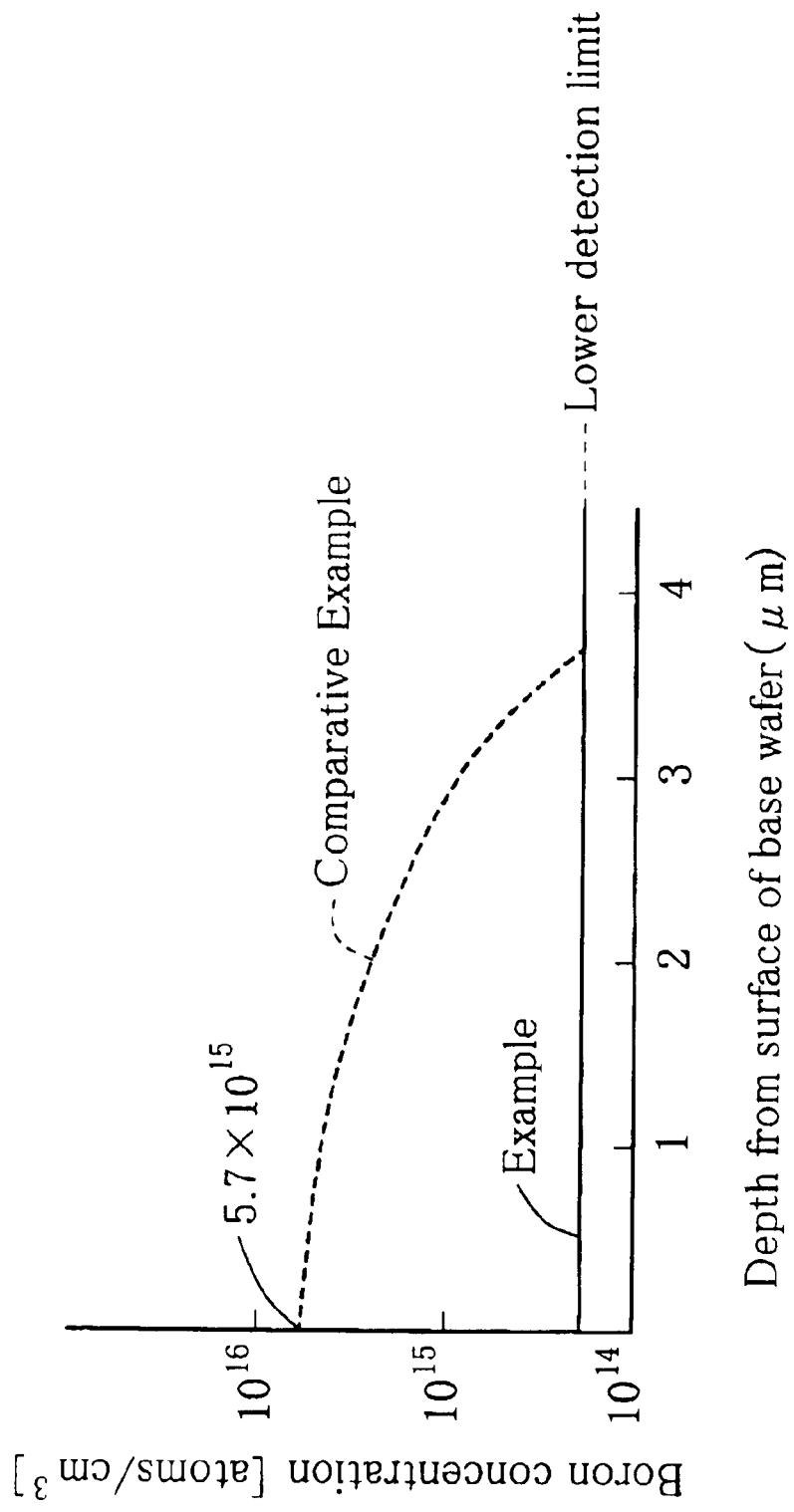
FIG. 6 is a graph showing measured boron concentration in an Example and Comparative Example.

The SOI layers of thus produced SOI wafers in Example and Comparative Example were removed by alkali etching, and depth profile of the boron concentration of each buried oxide film from the surface thereof along the sectional-thickness-wise direction was then measured by SIMS (secondary ion mass spectroscopy). It was confirmed from the measurement that, in Example, the boron concentration reached maximum at approx. 0.5 μm deep from the surface of the buried oxide film, which position corresponds to the bonding interface or around. On the contrary, the boron concentration of buried oxide film in Comparative Example only showed a slight increase in the vicinity of bonding interface, and the concentration in other area was below the lower detection limit. The depth profile of boron concentration was measured by SIMS also for the base wafer from the surface thereof after the buried oxide film was etched off using an aqueous HF solution. Results were shown in FIG. 6. While the SOI wafer of Comparative Example showed increase in the boron concentration (that is, reduction in the resistivity) towards the surficial portion of the base wafer, it was confirmed that the SOI wafer of Example showed the boron concentration in the surficial portion almost kept constant.

What is claimed is:

1. An SOI wafer comprising:

a silicon single crystal substrate;

a silicon oxide film formed on the main surface of the silicon single crystal substrate; and an SOI layer comprising a silicon single crystal layer formed on the silicon oxide film, wherein the silicon single crystal substrate has a bulk resistivity of 100 Ω·cm or above, and the silicon oxide film has a depth profile of boron concentration in which the boron concentration reaches maximum at a thickness-wise position closer to the silicon single crystal substrate away from the center of the film thickness.

* * * * *